(12) United States Patent
Zhu et al.

(10) Patent No.: US 10,574,239 B1
(45) Date of Patent: Feb. 25, 2020

(54) METHOD AND SYSTEM FOR PROVIDING REGIONAL ELECTRICAL GRID FOR POWER CONSERVATION IN A PROGRAMMABLE DEVICE

(71) Applicants: Jinghui Zhu, San Jose, CA (US); Jianhua Liu, Fremont, CA (US); Ning Song, Cupertino, CA (US)

(72) Inventors: Jinghui Zhu, San Jose, CA (US); Jianhua Liu, Fremont, CA (US); Ning Song, Cupertino, CA (US)

( * ) Notice: Subject to any disclaimer, the term of this patent is extended or adjusted under 35 U.S.C. 154(b) by 0 days.

(21) Appl. No.: 16/183,067

(22) Filed: Nov. 7, 2018

(51) Int. Cl.
*H03K 19/177* (2006.01)
*H03K 19/17784* (2020.01)
*H03K 19/17724* (2020.01)

(52) U.S. Cl.
CPC . *H03K 19/17784* (2013.01); *H03K 19/17724* (2013.01)

(58) Field of Classification Search
CPC ....... H03K 19/17772; H03K 19/17784; H03K 19/17724
USPC .......................................... 326/41
See application file for complete search history.

(56) References Cited

U.S. PATENT DOCUMENTS

2011/0199118 A1* 8/2011 Hill .................. H03K 19/17772
326/40

* cited by examiner

*Primary Examiner* — Daniel D Chang
(74) *Attorney, Agent, or Firm* — JW Law Group; James M. Wu

(57) ABSTRACT

A programmable semiconductor device capable of being selectively programmed to perform one or more logic functions includes a first region, second region, first regional power control ("RPC"), and second-to-first power control connection. The first region, in one embodiment, contains first configurable logic blocks ("CLBs") able to be selectively programmed to perform a first logic function. The second region includes a group of second CLBs configured to be selectively programmed to perform a second logic function. The first RPC port or inter-chip port which is coupled between the first and second regions facilitates dynamic power supply to the first region in response to the data in the second region. The second-to-first power control connection is used to allow the second region to facilitate and/or control power to the first region.

20 Claims, 8 Drawing Sheets

METHOD AND SYSTEM FOR PROVIDING REGIONAL ELECTRICAL GRID FOR POWER CONSERVATION IN A PROGRAMMABLE DEVICE

FIELD

The exemplary embodiment(s) of the present invention relates to the field of computer hardware and software. More specifically, the exemplary embodiment(s) of the present invention relates to power control for a programmable semiconductor device such as a field-programmable gate array ("FPGA") or programmable logic device ("PLD").

BACKGROUND

With increasing popularity of digital communication, artificial intelligence (AI), IoT (Internet of Things), and/or robotic controls, the demand for faster and efficient hardware and semiconductors with low power consumption is constantly in demand. To meet such demand, high-speed, flexible design, and low-power semiconductor chips are generally more desirable. Hardware industry typically has a variety of approaches to implement to achieve desirable logical functions.

A conventional approach uses dedicated custom integrated circuits and/or application-specific integrated circuits ("ASICs") to implement desirable functions. A shortcoming with ASIC approach is that this approach is generally expensive and limited flexibility. An alternative approach, which enjoys growing popularity, is utilizing programmable semiconductor devices ("PSD") such as programmable logic devices ("PLDs") or field programmable gate arrays ("FPGAs"). For instance, an end user can program a PSD to perform desirable functions.

A conventional PSD such as PLD or FPGA is a semiconductor chip that includes an array of programmable logic array blocks ("LAB s") or logic blocks ("LBs"), routing resources, and input/output ("I/O") pins. Each LAB may further include multiple programmable logic elements ("LEs"). For example, each LAB can include 16 LEs to 128 LEs, wherein each LE can be specifically programmed to perform a function or a set of functions.

A drawback associated with a conventional PLD or FPGA is that it is less power efficient.

SUMMARY

A programmable semiconductor device capable of being selectively programmed to perform one or more logic functions includes a first region, second region, first regional power control ("RPC"), and second-to-first power control connection. The first region, in one embodiment, contains first configurable logic blocks ("CLBs") able to be selectively programmed to perform a first logic function. The second region includes a group of second CLBs configured to be selectively programmed to perform a second logic function. The first RPC port or inter-chip port which is coupled between the first and second regions facilitates dynamic power supply to the first region in response to the data in the second region. The second-to-first power control connection is used to allow the second region to control or facilitate power-up or power-down to the first region.

Additional features and benefits of the exemplary embodiment(s) of the present invention will become apparent from the detailed description, figures and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
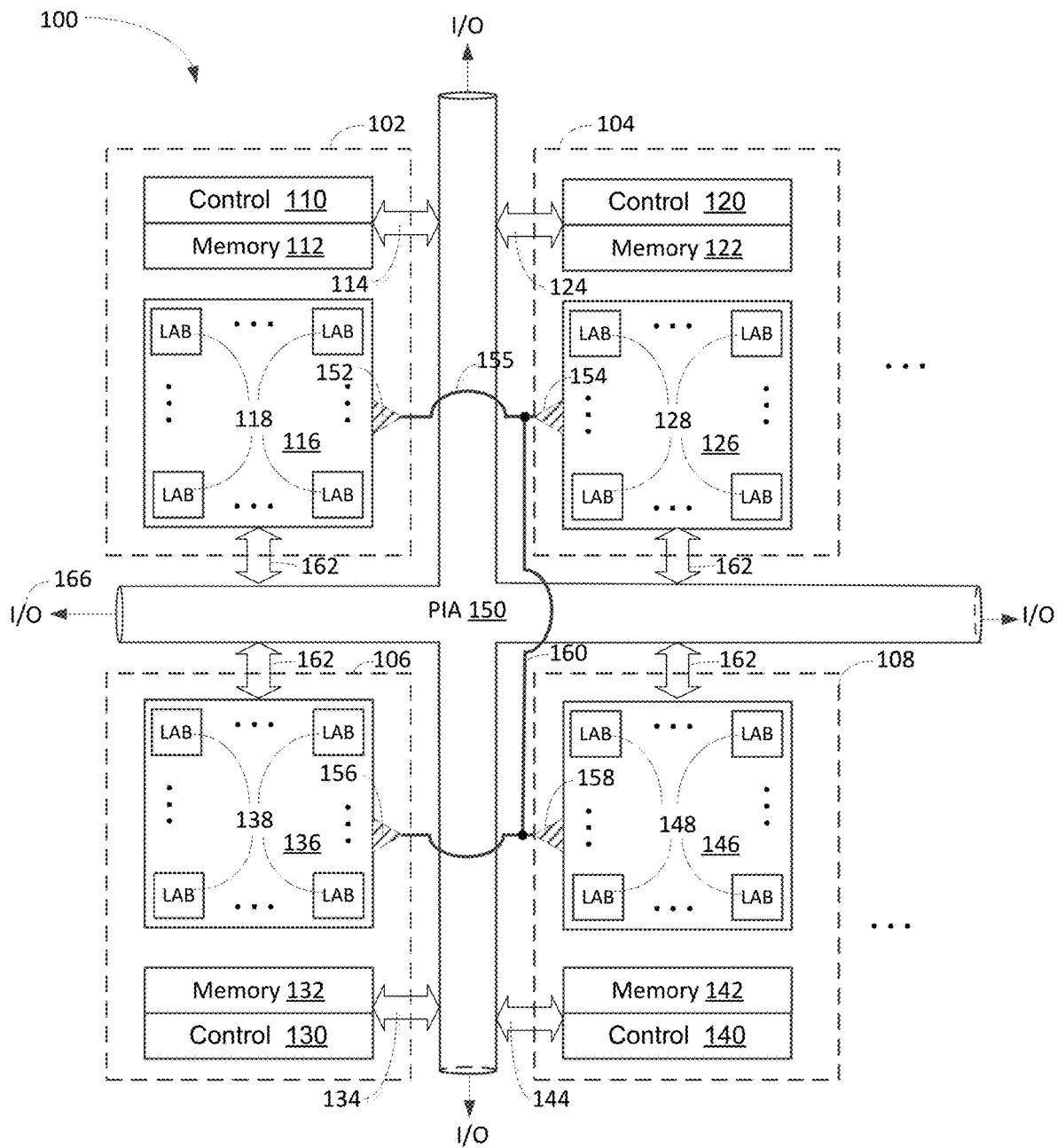
FIG. 1 is a block diagram illustrating a programmable semiconductor device ("PSD") capable of providing dynamic power control to partitioned regions in accordance with one embodiment of the present invention.

Embodiments of the present invention disclose a method(s) and/or apparatus for providing dynamic runtime power control for a configurable device or programmable semiconductor device ("PSD").

The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be understood that such a development effort might be complex and time-consuming but would nevertheless be a routine undertaking of engineering for those of ordinary skills in the art having the benefit of embodiment(s) of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

In accordance with the embodiment(s) of present invention, the components, process steps, and/or data structures described herein may be implemented using various types of operating systems, computing platforms, computer programs, and/or general-purpose machines. In addition, those of ordinary skills in the art will recognize that devices of a less general-purpose nature, such as hardware devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card and paper tape, and the like) and other known types of program memory.

The term "system" or "device" is used generically herein to describe any number of components, elements, subsystems, devices, packet switch elements, packet switches, access switches, routers, networks, computer and/or communication devices or mechanisms, or combinations of components thereof. The term "computer" includes a processor, memory, and buses capable of executing instruction wherein the computer refers to one or a cluster of computers, personal computers, workstations, mainframes, or combinations of computers thereof.

One embodiment of the presently claimed invention discloses a method or programmable semiconductor device ("PSD") capable of facilitating a dynamic runtime power control to a portion of the device. The PSD which can be an FPGA or PLD capable of being selectively programmed to perform one or more logic functions includes a first region, second region, first regional power control ("RPC"), and second-to-first power control connection. The first region, in one embodiment, contains first configurable logic blocks ("CLBs") able to be selectively programmed to perform a first logic function. The second region includes a group of second CLBs configured to be selectively programmed to perform a second logic function. The first RPC port or inter-chip port which is coupled between the first and second regions facilitates or control dynamic power supply to the first region in response to the data in the second region. The second-to-first power control connection is used to allow the second region to facilitate and/or control power to the first FIG. 1 is a block diagram 100 illustrating a PSD capable of providing dynamic power control according to a partitioned structure of PSD in accordance with one embodiment of the present invention. Diagram 100 includes multiple partitioned power regions ("PPR") 102-108, a programmable interconnection array ("PIA") 150, internal power distribution fabric ("PDF") 160, and input/output ("I/O") ports 166. PPRs 102-108, also known as electrical grids, further includes control units 110, 120, 130, 140, memory 112, 122, 132, 142, and logic blocks ("LBs") 116, 126, 136, 146. In one aspect, PDF 160 can be a part of PIA 150. Note that control units 110, 120, 130, 140 can be configured into one single control unit, and similarly, memory 112, 122, 132, 143 can also be configured into one single memory device for storing configurations. It should be noted that the underlying concept of the exemplary embodiment(s) of the present invention would not change if one or more blocks (circuit or elements) were added to or removed from diagram 100.

In one embodiment, PSD, also known as PLD or FPGA, is being logically and/or physically partitioned in accordance with power distribution boundaries or electrical grids such as PPR 102-108. For example, while PPR 102 is fully operational performing various data processing and computing, PPR 104 can be in sleeping mode with minimal power consumption. The sleeping mode, in one aspect, is a power conserving mode that powers down most, if not all, LAB s within the LB while maintaining the configuration data. In one aspect, the configuration data can be continuously updated while the associated LB is in sleeping mode. For example, PSD activates a dynamic runtime power controller ("DRPC") to power down (or power up) LB 126 while controlling sufficient power to memory 122 for maintaining configuration data for LB 126.

LBs 116, 126, 136, 146, include multiple LABs 118, 128, 138, 148, wherein each LAB is organized to contain, among other circuits, a set of programmable logical elements ("LEs") or macrocells, not shown in FIG. 1. For example, each LAB can include anywhere from 32 to 512 programmable LEs. I/O pins (not shown in FIG. 1), LABs, and LEs are linked by PIA 150 and/or other buses, such as buses 162, 114, 124, 134, 144, for facilitating communication between PIA 150 and PPRs 102-108. Each LE includes programmable circuits such as the product-term matrix, and registers. For example, every LE can be independently configured to perform sequential and/or combinatorial logic operation(s). It should be noted that the underlying concept of PSD would not change if one or more blocks and/or circuits were added or removed from PSD.

Control units 110, 120, 130, 140, in one embodiment, can be a single control unit. Control unit 110, for instance, manages and/or configures individual LE in LAB 118 based on the configuration stored in memory 112. It should be noted that some I/O ports or I/O pins can also be programmed as input pins as well as output pins. Some I/O pins can be further programmed as bi-directional I/O pins that are capable of receiving and sending signals at the same time. The control units such as unit 110 can also be used to handle and/or provide system clock signals for the PSD.

LBs 116, 126, 136, 146 are programmable by the end users. Depending on applications, LBs can be configured to perform user specific functions based on predefined functional library managed by programming software. Based on configurations, a portion of PSD such as PPRs 106-108 can be dynamically powered up or powered down depending on input data and/or data processing in other PPRs such as PPR 102-104. A benefit for shutting down one or more PPRs while maintaining their configurations is to conserve power. PSD, in some applications, also includes a set fixed circuits for performing specific functions. For example, PSD can include a portion of semiconductor area for a fixed non-programmable processor for enhance computation power.

PIA 150 is coupled to LBs 116, 126, 136, 146 via various internal buses such as buses 114, 124, 134, 144, 162. In some embodiments, buses 114, 124, 134, 144, 162 and PDF 160 are part of PIA 150. Each bus includes channels or wires for transmitting signals. It should be noted that the terms channel, routing channel, wire, bus, connection, and interconnection are referred to similar connections and will be used interchangeably herein. PIA 150, not shown in FIG. 1, can also be used to receives and/or transmits data directly or indirectly from/to other devices via I/O pins and LABs.

PSD, in one aspect, able to be selectively programmed to perform one or more logic functions includes a first region such as PPR 102, a second region such as PPR 104, a first RPC port and a second-to-first power control connection such as PDF 160. The first region including a set of first LABs can be selectively programmed to perform a first logic function. The second region containing a set of second LABs can also be selectively programmed to perform a second logic function. The first RPC port such as inter-chip port 152 can be configured to dynamically control power supply to the first region. The first RPC port such as inter-chip port 152 couples to various power supply connections in the first region for power management. The second-to-first power control connection such as channel 155 is configured to allow the second region such as PPR 104 to control power supply to the first region such as PPR 102.

PSD, in one embodiment, further includes a second RPC port such as inter-chip port 154, a first-to-second power control connection such as channel 155, a first configuration memory such as memory 112, a second configuration memory such as memory 122. The second RPC input is able to dynamically control power supply to the second region. The first-to-second power control connection is configured to allow the first region such as PPR 102 to selectively control power supply to the second region such as PPR 104. The first configuration memory such as memory 112 stores the first configuration for the first region and the second configuration memory such as memory 122 stores second configuration for the second region. It should be noted that the first region can switch into a sleep mode when the input at the first RPC port provides substantially no power.

In one aspect, PSD further includes a third region such as PPR 106, a third-to-first power control connection. The third region contains a set of third LABs such as LABs 138 and is configured to be selectively programmed to perform a third logic function. The third-to-first power control connection, coupling between the third region and the first RPC port, is configured to allow the third region to control power supply to the first region such as PPR 102. It should be noted that channel 155 and/or 160 is a logical illustration wherein channel 155 and/or 160 can be implemented by PIA 150. Also, RPC ports such as ports 152-158 can be an internal circuit such as multiplexer and/or switcher configured to switch on or off power supply to a connected region or PPR.

An advantage of employing DRPC is to conserve power consumption within PSD by partitioning PSD into multiple electrical grids or regions based on separable power boundary.

Figure 2:
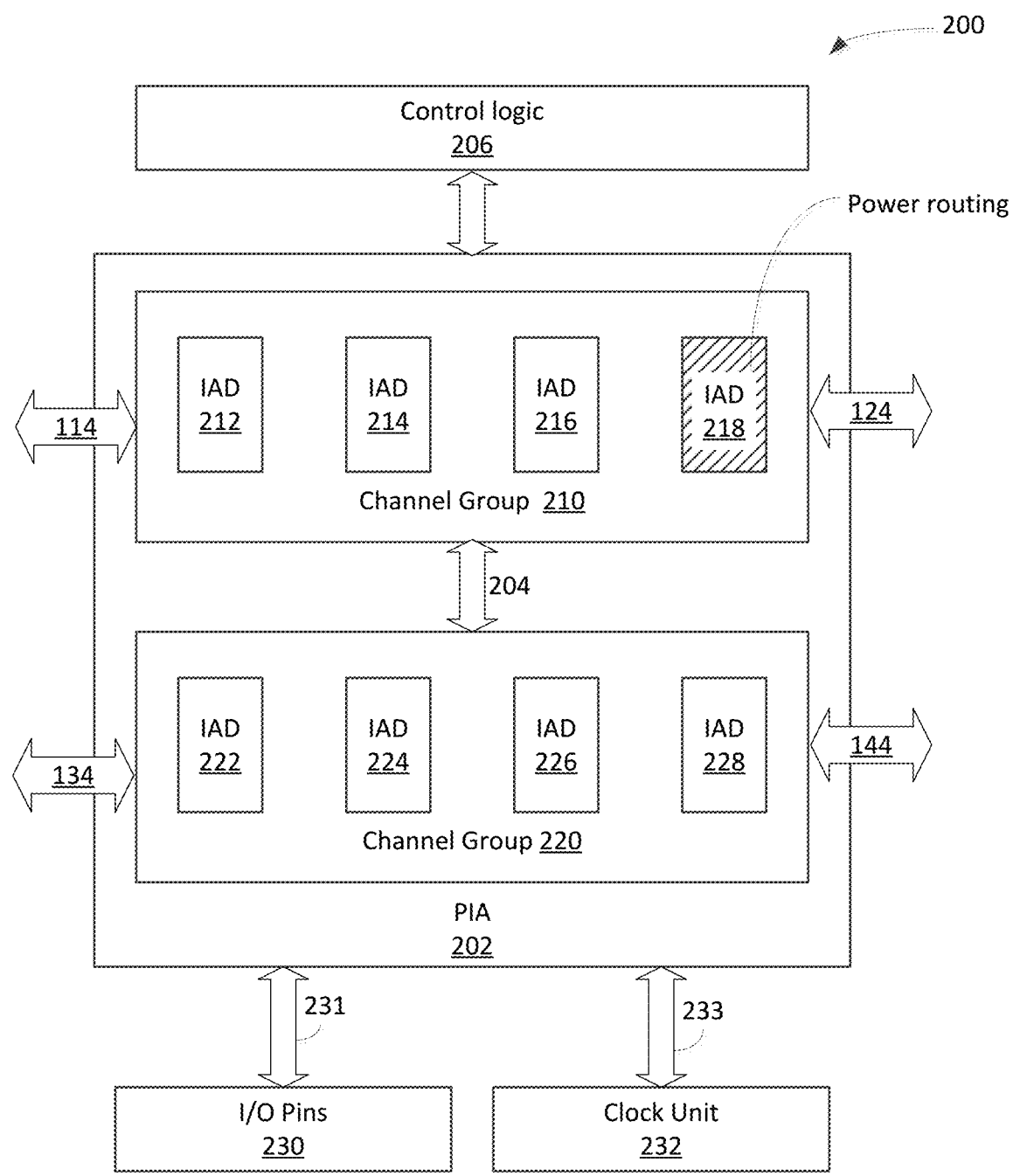
FIG. 2 is a block diagram illustrating a routing logic or routing fabric containing programmable interconnection arrays in PSD in accordance with one embodiment of the present invention.

FIG. 2 is a block diagram 200 illustrating a routing logic or routing fabric containing programmable interconnection arrays in PSD in accordance with one embodiment of the present invention. Diagram 200 includes control logic 206, PIA 202, I/O pins 230, and clock unit 232. Control logic 206, which may be similar to control units shown in FIG. 1, provides various control functions including channel assignment, differential I/O standards, and clock management. Control logic 206 can includes volatile memory, non-volatile memory, and/or a combination of volatile and nonvolatile memory device. The memory devices include, but not limited to, flash memory, electrically erasable programmable read-only memory ("EEPROM"), erasable programmable read-only memory ("EPROM"), fuses, anti-fuses, magnetic RAM ("MRAM"), SRAM, Dynamic Random-Access Memory ("DRAM"), and/or ROM, for storing data as well as configuration. In one embodiment, control logic 206 is incorporated into PIA 202. It should be noted that the underlying concept of the exemplary embodiment(s) of the present invention would not change if one or more blocks (circuit or elements) were added to or removed from diagram 200.

I/O pins 230, in one example, connected to PIA 202 via a bus 231, includes multiple programmable I/O pins that can receive and transmit signals to outside of PSD. Each programmable I/O pin, for instance, can be configured as to whether it is an input, output, and/or bi-directional pin. I/O pins 230 may be incorporated into control logic 206 depending on applications.

Clock unit 232, in one example, connected to PIA 202 via a bus 233, receives various clock signals from other components, such as a clock tree circuit or a global clock oscillator. Clock unit 232, in one instance, generates clock signals in response to system clocks as well as reference clocks for implementing I/O communications. Depending on the applications, clock unit 232 provides clock signals to PIA 202 including reference clock(s).

PIA 202, in one aspect, is organized in an array scheme having multiple channel groups 210 and 220, bus 204, and I/O buses 114, 124, 134, 144. Channel groups 210, 220 are used to facilitate routing information between LBs based on PIA configurations. Channel groups can also communicate with each other via internal buses or connections such as bus 204. Channel group 210 further includes interconnect array decoders ("IADs") 212-218 and channel group 220 includes four IADs 222-228. A function of IAD is to provide a configurable routing resources for data transmission.

For example, an IAD such as IAD 212 includes routing circuits, such as routing multiplexers or selectors, hereinafter called multiplexers, for routing various signals between I/O pins, feedback outputs, and LAB inputs. Each IAD is organized in a number of multiplexers for routing various signals received by IAD. For example, an IAD can include 36 multiplexers which can be laid out in four banks that each bank contains nine rows of multiplexers. Thus, each bank of IAD, for instance, can choose any one or all of the nine multiplexers to route one or nine signals that IAD receives. It should be noted that the number of IADs within each channel group is a function of the number of LEs within the LAB. In one embodiment, IAD is programmable and it can be configured to route the signals in a most efficient way. To enhance routability, IAD employs configurable multiplexing structures so that a configurable mux allows a portion of its mux to be used by another mux in an adjacent IAD.

In one embodiment, PIA 202 is configured to designate a special IAD such as IAD 218 as a power routing IAD. For example, IAD 218 is configured to dynamically facilitate and/or control power to certain PPR(s) during runtime. It should be noted that dynamic power supply during runtime can be referred to as automatic power-up or power-down PPR for power conservation during runtime. In one aspect, IAD 218 is used to facilitate PDF for facilitating and/or controlling power supply to various PPRs during operation based on the instruction from DRPC.

An advantage of using IAD 218 within PIA as a designated power routing is that PDF can be configured to be a part of PIA.

Figure 3:
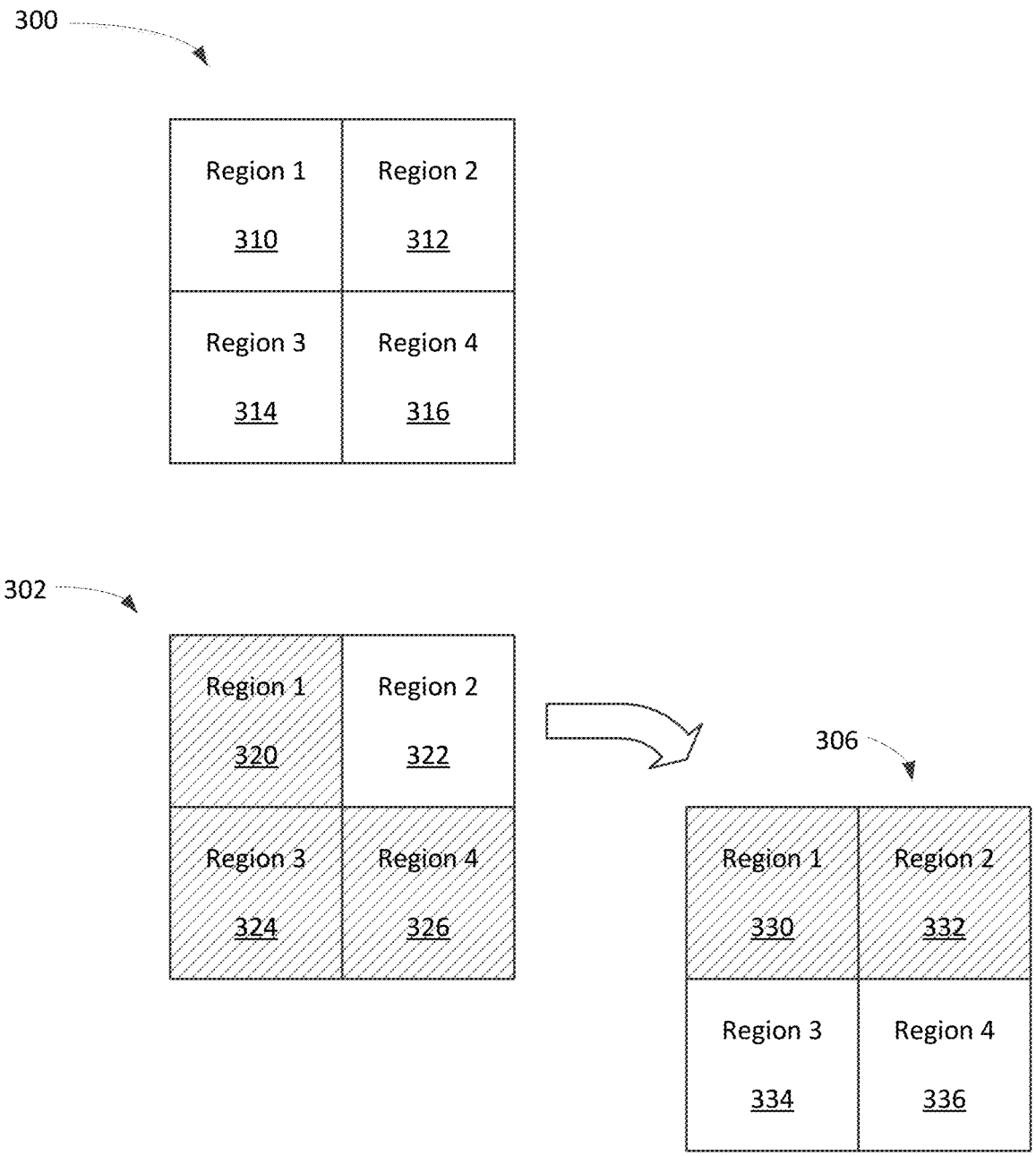
FIG. 3 illustrates block diagrams showing a partitioned PSD capable of being powered down or up a region of PSD using internal control signals generated by another region of PSD in accordance with one embodiment of the present invention.

FIG. 3 illustrates block diagrams 300-306 showing a partitioned PSD capable of being powered down or up a region of PSD using internal control signals generated by another region of PSD in accordance with one embodiment of the present invention. Diagram 300 illustrates a PSD divided into four (4) regions or electrical grids 310-316 wherein each region can be independently powered up or powered down based on the processed data. It should be noted that a PSD can be divided any number of power regions based on the applications and technologies. It should be noted that the underlying concept of the exemplary embodiment(s) of the present invention would not change if one or more blocks (circuit or elements) were added to or removed from diagram 300.

PSD shown in diagram 300 illustrates an FPGA fabric that is physically partitioned into multiple physical power regions 310-316. While the number of partitioned regions may vary, PSD or FPGA, in the present embodiment, is divided into four (4) regions that can be independently powered up or powered down based on input data. While PSD showing in diagram 300 is partitioned divided into four (4) substantially identical squared-shaped partitioned region, the shape of each region can vary depending on the applications.

Diagram 302, which is similar to diagram 300, illustrates a PSD having four (4) regions or PPRs wherein PPRs 320 and 324-326 are powered up and operating normally while PPR 322 is powered down in a sleeping mode. When a power region such as PPR 322 is being powered down, it consumes a small amount of power just enough to maintain its configuration. Since the configuration of a powered-down region or PPR is maintained in a memory, the powered-down region can be powered up quickly. It should be noted that when the configuration keeps unchanged during power down mode, the process of power-up can be completed almost immediately, within 5 to 100 nanoseconds ("ns") depending on the applications as well as semiconductor technologies.

Diagram 306, which is similar to diagram 302, illustrates a transition of dynamic runtime power-up and/or power-down for a PSD. For example, PPR 322 in diagram 302 is powered up in diagram 306 as PPR 332. PPRs 324-326 in diagram 302 are powered down in diagram 306 as PPRs 334-336. It should be noted that during the runtime, each power region or PPR can be independently powered down or powered up dynamically based on certain conditions. For example, the conditions for powering-up or powering-down a PPR(s) can be input data by another region. Another condition can be processing results by another PPR. Furthermore, the condition can be set up by an external device or processor(s).

An advantage of placing individual PPR into sleeping mode is to conserve power consumption.

Figure 4:
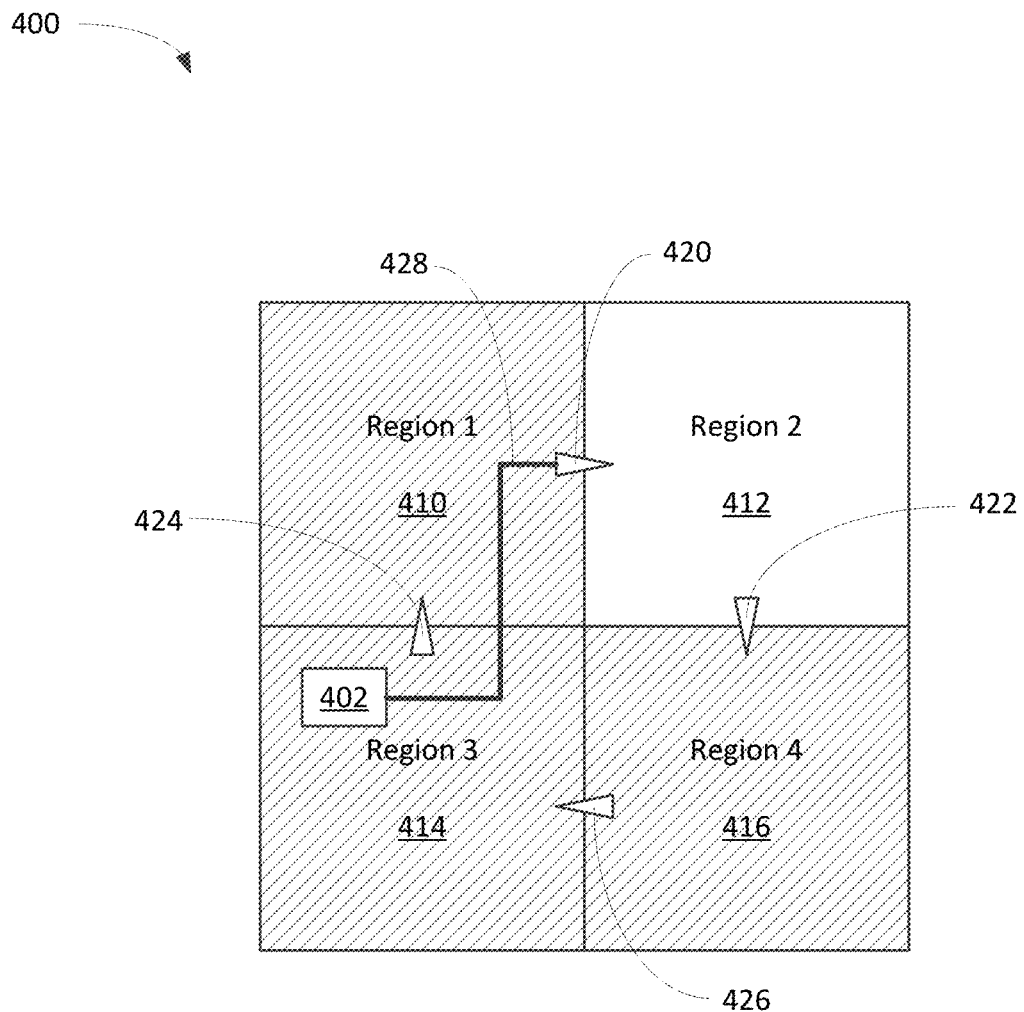
FIG. 4 is a block diagram illustrating a partitioned PSD containing regional power control ("RPC") ports in accordance with one embodiment of the present invention.

FIG. 4 is a block diagram illustrating a partitioned PSD 400 containing regional power control ("RPC") ports in accordance with one embodiment of the present invention. PSD 400 includes four (4) PPRs 410-416, four (4) RPC ports 420-426, and PDF 428. While PPRs 410 and 414-416 are operating normally, PPR 412 is in the sleeping mode. In one aspect, RPC ports which are inter-chip ports or connectors can be configured to facilitate, control, and/or transmit power supply to connected PPRs. For example, RPC port 420 is dedicated to control power or power supply to PPR 412, and RPC port 426 is configured to control power supply to PPR 414. It should be noted that the underlying concept of the exemplary embodiment(s) of the present invention would not change if one or more blocks (circuit or elements) were added to or removed from PSD 400.

RPC ports 420-426, in one embodiment, are used to facilitate regional power control input to PPRs 410-416. It should be noted that each region has a regional power control input to perform region-power-down or region-power-up. In one aspect, regional power control input is connected to fabric routing via RPC ports. In another embodiment, logics or data outside of a power region can be routed to the region power control input.

In operation, LAB 402 in PPR 414 generates power control signal based on input data and subsequently sends the power signal or power control signal to PPR 412 through RPC port 420 via PDF such as connection or PDF 428. Upon arrival to PPR 412, PPR 412 wakes up based on stored configurations. PPR 412 operates normally as soon as the power becomes available and continuously flows from region 3 to region 2 via RPC port 420.

Figure 5:
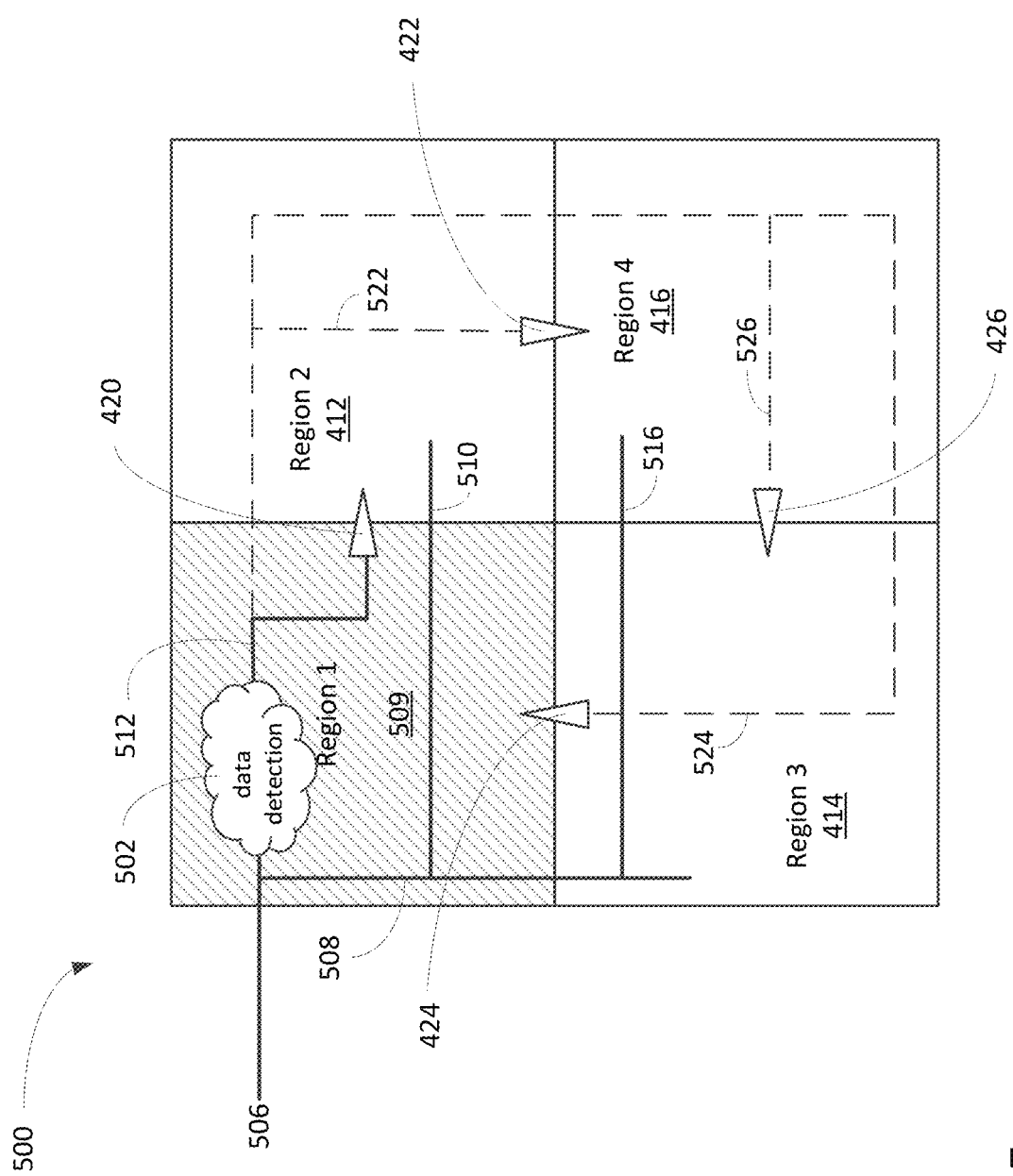
FIG. 5 shows an exemplary illustration of a partitioned PSD containing RPC ports for power management in accordance with one embodiment of the present invention.

FIG. 5 shows an exemplary illustration of a partitioned PSD 500 containing RPC ports for power management in accordance with one embodiment of the present invention. PSD 500, which is similar to PSD 400 shown in FIG. 4, includes four (4) PPRs 509, 412-416, four (4) RPC ports 420-426, and PDF 508-512. While PPR 509 is operating normally, PPRs 412-416 are in sleeping modes. In one aspect, RPC ports 420-426 are configured to facilitate and/or control power supply to PPRs 509 and 412-416. For example, RPC port 420 is dedicated to facilitate and/or control power to PPR 412, and RPC port 426 is configured to facilitate and/or control power to PPR 414. It should be noted that the underlying concept of the exemplary embodiment(s) of the present invention would not change if one or more blocks (circuit or elements) were added to or removed from PSD 500.

PPR 509, in one aspect, is programmed to have a data detecting logic 502 which is configured to receive an input data 506 and provide power signal or power control signal controlling power supply to PPR 412 based on input data 506. Data detecting logic 502, which can be configured a portion of LABs within PPR 509, is coupled to PPRs 412-416 via connections 508-516 wherein connection 512 is coupled to RPC port 420 for power supply. In one embodiment, PSD 500 is so programmed that allows one or more types of applications to shut down computing when the data is not available. When, for example, the data becomes available, data detecting logic 502 can wake up all computing functions such as PPR 412.

In operation, upon receipt of input data 506, data detecting logic 502 generates power control or power signal as power supply based on input data 506. Upon processing and verifying input data 506, data detecting logic 502 sends the power control signal to PPR 412 via connection 512 and RPC port 420 to wake up PPR 412. In one aspect, data detecting logic 502 is also capable of providing power control signals to RPC ports 422 426, 424 to switch on or off associated regions such as PPR 412, 414, and/or 416 as indicated by numerals 522, 514, or 516. After reloading the configuration from a local memory, PPR 412 begins to operate and/or process information in response to input data 506. Depending on the applications, RPC ports such as ports 420-422 can be configured to receive power control signals, power supply, or a combination of control signals and power supply.

An advantage of waking up one or more PPRs based on input data is that PPRs can be powered down until the data becomes available. Such applications are especially useful in an artificial intelligent ("AI") application because many logic devices in AI system need not to be operable until certain data becomes available.

Figure 6:
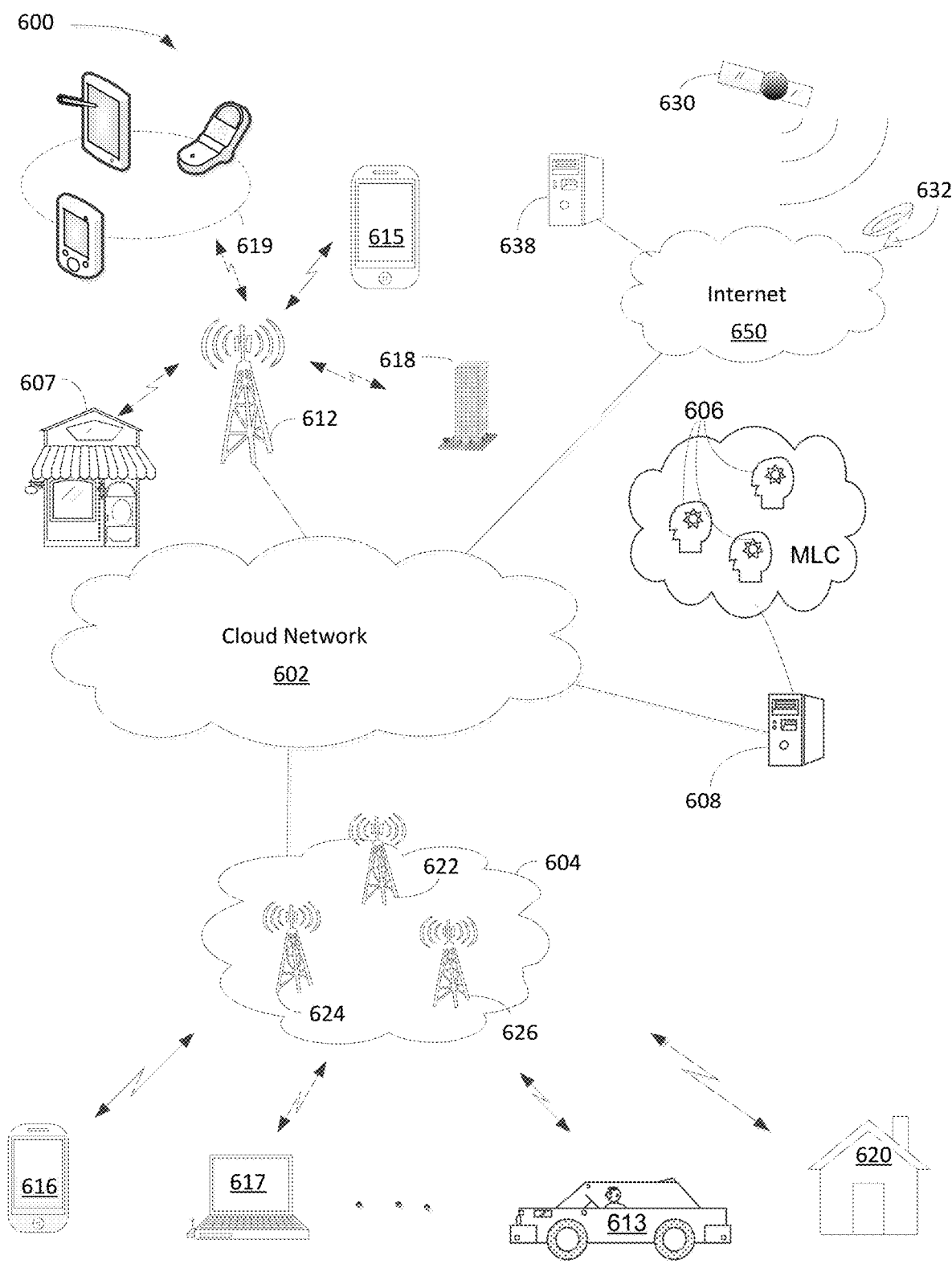
FIG. 6 is a block diagram illustrating various systems connected to a cloud-based communication network using partitioned PSDs in accordance with one embodiment of the present invention.

FIG. 6 is a block diagram 600 illustrating various systems connected to a cloud-based communication network using partitioned PSDs in accordance with one embodiment of the present invention. Diagram 600 illustrates AI server 608, communication network 602, switching network 604, Internet 650, and portable electric devices 613-619. Network or cloud network 602 can be wide area network ("WAN"), metropolitan area network ("MAN"), local area network ("LAN"), satellite/terrestrial network, or a combination of WAN, MAN, and LAN. It should be noted that the underlying concept of the exemplary embodiment(s) of the present invention would not change if one or more blocks (or networks) were added to or removed from diagram 600.

Network 602 includes multiple network nodes, not shown in FIG. 6, wherein each node may include mobility management entity ("MME"), radio network controller ("RNC"), serving gateway ("S-GW"), packet data network gateway ("P-GW"), or Home Agent to provide various network functions. Network 602 is coupled to Internet 650, AI server 608, base station 612, and switching network 604. Server 608, in one embodiment, includes machine learning computers ("MLC") 606 using partitioned PSD with DRPC for power conservation.

Switching network 604, which can be referred to as packet core network, includes cell sites 622-626 capable of providing radio access communication, such as 3G ($3^{rd}$ generation), 4G, or 5G cellular networks. Switching network 604, in one example, includes IP and/or Multiprotocol Label Switching ("MPLS") based network capable of operating at a layer of Open Systems Interconnection Basic Reference Model ("OSI model") for information transfer between clients and network servers. In one embodiment, switching network 604 is logically coupling multiple users and/or mobiles 616-620 across a geographic area via cellular and/or wireless networks. It should be noted that the geographic area may refer to a campus, city, metropolitan area, country, continent, or the like.

Base station 612, also known as cell site, node B, or eNodeB, includes a radio tower capable of coupling to various user equipments ("UEs") and/or electrical user equipments ("EUEs"). The term UEs and EUEs are referring to the similar portable devices and they can be used interchangeably. For example, UEs or PEDs can be cellular phone 615, laptop computer 617, iPhone® 616, tablets and/or iPad® 619 via wireless communications. Handheld device can also be a smartphone, such as iPhone®, BlackBerry®, Android®, and so on. Base station 612, in one example, facilitates network communication between mobile devices such as portable handheld device 613-619 via wired and wireless communications networks. It should be noted that base station 612 may include additional radio towers as well as other land switching circuitry.

Internet 650 is a computing network using Transmission Control Protocol/Internet Protocol ("TCP/IP") to provide linkage between geographically separated devices for communication. Internet 650, in one example, couples to supplier server 638 and satellite network 630 via satellite receiver 632. Satellite network 630, in one example, can provide many functions as wireless communication as well as global positioning system ("GPS"). In one aspect, partitioned PSD with DRPC can be used in all applicable devices, such as, but not limited to, smartphones 613-619, satellite network 630, automobiles 613, AI server 608, business 607, and homes 620.

An advantage of employing partitioned PSD is to facilitate power conservation in a network (or IA) environment.

The exemplary embodiment of the present invention includes various processing steps, which will be described below. The steps of the embodiment may be embodied in machine or computer executable instructions. The instructions can be used to cause a general purpose or special purpose system, which is programmed with the instructions, to perform the steps of the exemplary embodiment of the present invention. Alternatively, the steps of the exemplary embodiment of the present invention may be performed by specific hardware components that contain hard-wired logic for performing the steps, or by any combination of programmed computer components and custom hardware components.

Figure 7:
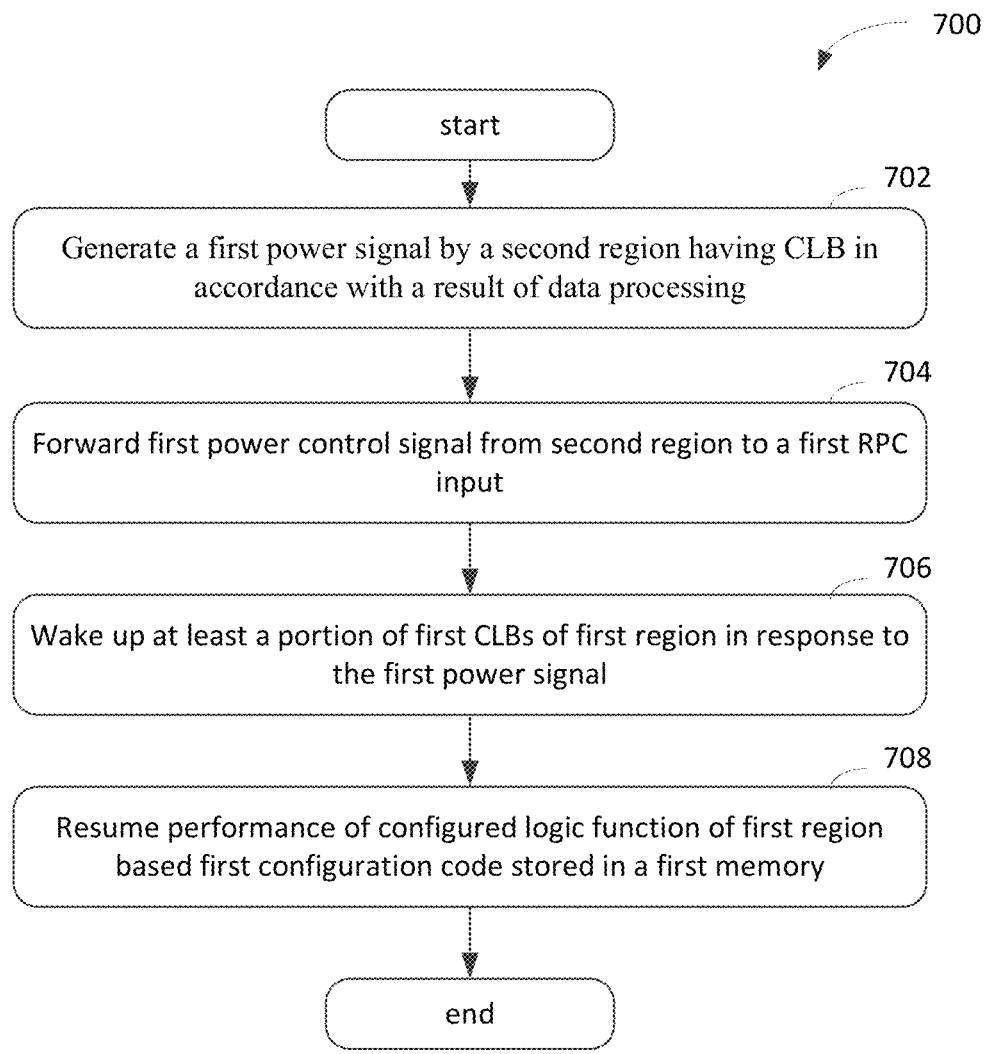
FIG. 7 is a flowchart illustrating a process of power distribution to a partitioned PSD in accordance with one embodiment of the present invention.

FIG. 7 is a flow charge 700 illustrating a process of efficient power distribution to a partitioned PSD in accordance with one embodiment of the present invention. At block 702, a process of dynamic power-down and/or power-up at least a portion of a PSD generates a first power control signal by a second region having a set of second configurable logic blocks ("LBs") in accordance with a result of data processing by at least a portion of the second LBs.

At block 704, after forwarding the first power control signal from the second region to a first RPC port which could be situated adjacent or remotely to a first region via a second-to-first power connection connecting the second region to the first region, at least a portion of the first LBs of the first region, at block 706, is woken in response to the first power control signal as power supply to the first region.

At block 708, the process resumes the performance of configured logic function of the first region based first configuration code stored in a first memory. In one embodiment, the process is further capable of maintaining or controlling power supply to the first memory while the first region is phased into the sleeping mode for power consumption. In one example, after terminating the first power control signal by the second region according to a second result from data processing by at least a portion of the plurality of second LBs, the first region is powered down when the first RPC input stops receiving the first power control signal. The process is further capable of storing configuration data and intermediary results in the first memory before the first region goes to sleep mode.

The process, in one embodiment, is further able to generate a third power control signal by the first region in accordance with a result of data processing by at least a portion first LBs of the first region. Upon forwarding the third power control signal from the first region to a third RPC input situated adjacent to a third region via a first-to-third power connection coupling the third region with the first region, a portion of third LBs of the third region is woken or activated in response to the third power control signal for controlling and facilitating power supply to the third region. The third region resumes the performance of configured logic function based first configuration code stored in a first memory.

Figure 8:
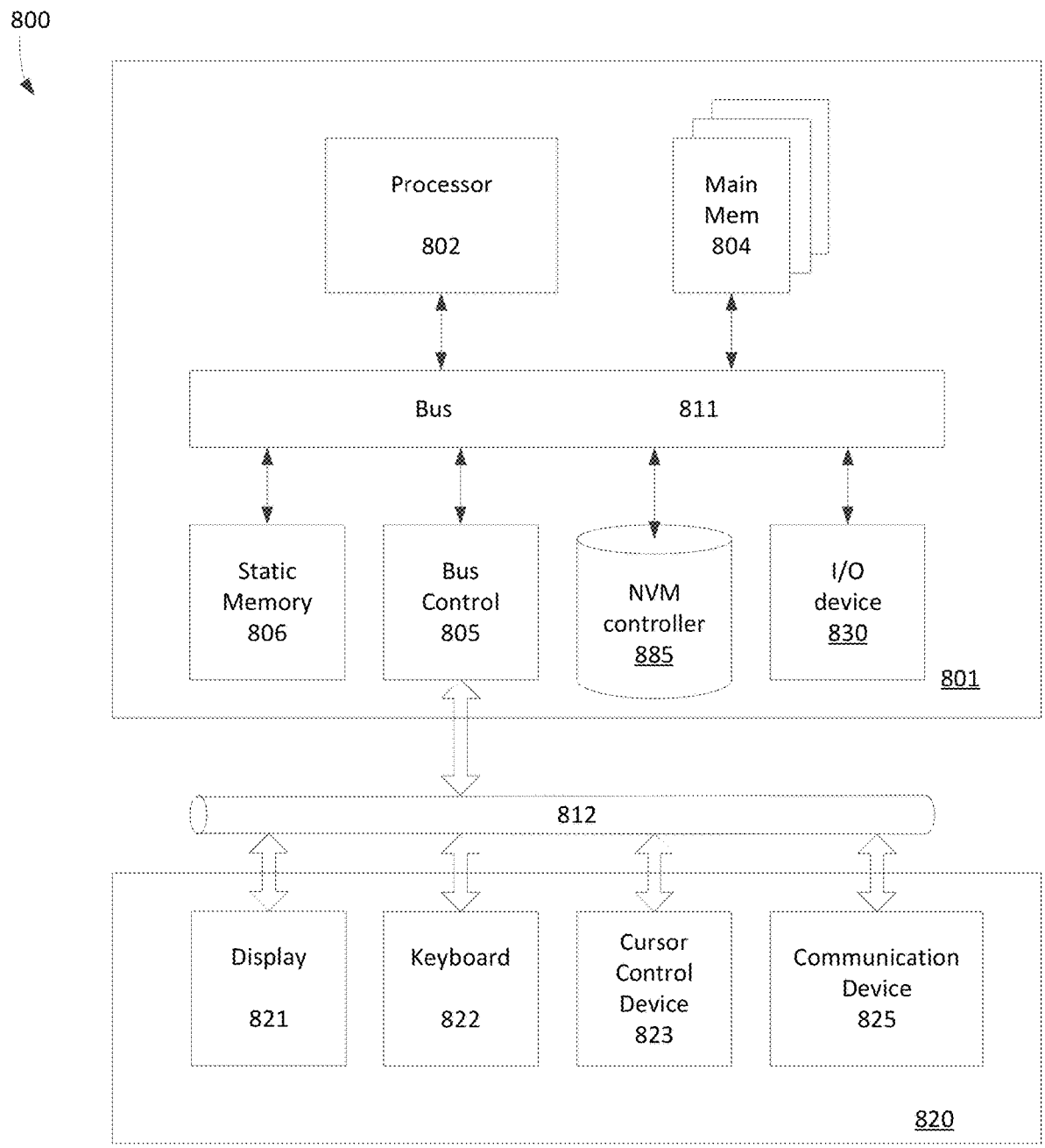
FIG. 8 is a diagram illustrating a digital processing system using partitioned PSD capable of providing various function in accordance with one embodiment of the present invention.

FIG. 8 is a diagram illustrating a digital processing system 800 using partitioned PSD capable of providing various function in accordance with one embodiment of the present invention. Computer system 800 can include a processing unit 801, an interface bus 812, and an input/output ("IO") unit 820. Processing unit 801 includes a processor 802, main memory 804, system bus 811, static memory device 806, bus control unit 805, I/O element 830, and NVM controller 885. It should be noted that the underlying concept of the exemplary embodiment(s) of the present invention would not change if one or more blocks (circuit or elements) were added to or removed from FIG. 8.

Bus 811 is used to transmit information between various components and processor 802 for data processing. Processor 802 may be any of a wide variety of general- purpose processors, embedded processors, or microprocessors such as ARM® embedded processors, Intel® Core™ Duo, Core™ Quad, Xeon®, Pentium™ microprocessor, Motorola™ 68040, AMD® family processors, or Power PC™ microprocessor.

Main memory 804, which may include multiple levels of cache memories, stores frequently used data and instructions. Main memory 804 may be RAM (random access memory), MRAM (magnetic RAM), or flash memory. Static memory 806 may be a ROM (read-only memory), which is coupled to bus 811, for storing static information and/or instructions. Bus control unit 805 is coupled to buses 811-812 and controls which component, such as main memory 804 or processor 802, can use the bus. Bus control unit 805 manages the communications between bus 811 and bus 812. Mass storage memory or SSD which may be a magnetic disk, an optical disk, hard disk drive, floppy disk, CD-ROM, and/or flash memories are used for storing large amounts of data.

I/O unit 820, in one embodiment, includes a display 821, keyboard 822, cursor control device 823, and communication device 825. Display device 821 may be a liquid crystal device, cathode ray tube ("CRT"), touch-screen display, or other suitable display device. Display 821 projects or displays images of a graphical planning board. Keyboard 822 may be a conventional alphanumeric input device for communicating information between computer system 800 and computer operator(s). Another type of user input device is cursor control device 823, such as a conventional mouse, touch mouse, trackball, or other type of cursor for communicating information between system 800 and user(s).

Communication device 825 is coupled to bus 811 for accessing information from remote computers or servers, such as server or other computers, through wide-area network. Communication device 825 may include a modem or a network interface device, or other similar devices that facilitate communication between computer 800 and the network. Computer system 800 may be coupled to a number of servers via a network infrastructure such as the infrastructure illustrated in FIG. 6.

While particular embodiments of the present invention have been shown and described, it will be obvious to those of ordinary skills in the art that based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. A programmable semiconductor device able to be selectively programmed to perform one or more logic functions comprising:
    a first region containing a plurality of first configurable logic blocks ("LBs") able to be selectively programmed to perform a first logic function;
    a second region containing a plurality of second LBs coupled to the plurality of first LBs and configured to be selectively programmed to perform a second logic function;
    a first regional power control ("RPC") port coupled to the first region and configured to dynamically control power supply to the first region;
    a second-to-first power control connection, coupling between the second region and the first RPC port, configured to allow the second region to control power supply to the first region based on second input data received by the second region; and
    a first-to-fourth power control connection, coupling between the first region and a fourth RPC port, configured to allow the first region to control power supply to a fourth region based on first input data received by the first region.

2. The device of claim 1, further comprising a second RPC port coupled to the second region and configured to dynamically control power supply to the second region.

3. The device of claim 2, further comprising a first-to-second power control connection, coupling between the first region and the second RPC port, configured to allow the first region to selectively control power supply to the second region.

4. The device of claim 1, further comprising a first configuration memory coupled to the first region and figured to store first configuration for the first region.

5. The device of claim 1, further comprising a second configuration memory coupled to the second region and figured to store second configuration for the second region.

6. The device of claim 1, wherein the first region is configured to switch into a sleep mode when the first RPC port provides substantially no power.

7. The device of claim 1, wherein the first RPC port couples to various power supply connections in the first region for power management.

8. The device of claim 1, further comprising:
    a third region containing a plurality of third LBs coupled to the first region and configured to be selectively programmed to perform a third logic function; and
    a third-to-first power control connection, coupling between the third region and the first RPC port, configured to allow the third region to control power supply to the first region.

9. A method of dynamically power-down and power-up a portion of a programmable semiconductor device, comprising:
    generating a first power control signal by a second region having a plurality of second configurable logic blocks ("LBs") in accordance with a result of second input data processing by at least a portion of the plurality of second LBs;
    forwarding the first power control signal from the second region to a first regional power control ("RPC") port via a second-to-first power connection coupling the second region to the first region;
    waking up at least a portion of a plurality of first LBs of the first region in response to the first power control signal facilitating power supply to the first region;
    resuming performance of configured logic function of the first region based first configuration code stored in a first memory;
    generating a second power control signal by a fourth region having a plurality of second configurable LBs in response to a second result processed in accordance with a fourth input; and
    sending the second power control signal to the second region for controlling power supply to the second region.

10. The method of claim 9, further comprising maintaining power supply to the first memory while the first region is phased into sleeping mode for power consumption.

11. The method of claim 9, further comprising terminating the first power control signal by the second region according to a second result from data processing by at least a portion of the plurality of second LBs.

12. The method of claim 11, further comprising powering down the first region when the first RPC port stops receiving the first power control signal.

13. The method of claim 12, further comprising storing configuration data and intermediary results in the first memory before the first region goes to sleep mode.

14. The method of claim 9, further comprising:
generating a third power control signal by the first region in accordance with a result of data processing by at least a portion of the plurality of first LBs of the first region;
forwarding the third power control signal from the first region to a third RPC port situated adjacent to a third region via a first-to-third power connection coupling the third region with the first region;
waking up at least a portion of a plurality of third LBs of the third region in response to the third power control signal facilitating power supply to the third region; and
resuming performance of configured logic function of the third region based first configuration code stored in a first memory.

15. A programmable semiconductor device able to be selectively programmed to perform one or more logic functions comprising:
a plurality of configuration memories for storing configuration program;
a plurality of routing fabric configured to route information within the programmable semiconductor device;
a plurality of physical power regions ("PPRs") wherein each PPR includes multiple configurable logic blocks ("LBs") able to be selectively programmed to perform multiple functions;
a plurality of region power control ("RPC") ports coupled to the plurality of PPRs for allowing each PPR to independently provide a power supply to a neighboring PPR in response to a result processed based on input data received at each PPR.

16. The device of claim 15, wherein each of the plurality of RPC ports is being controlled by at least one of the PPRs.

17. The device of claim 15, further comprising a power distribution fabric ("PDF") coupled to the plurality of PPRs and configured to facilitate internal power supply.

18. The device of claim 15, further comprising programmable interconnection array ("PIA") coupled to the plurality of the PPRs for facilitating dynamic runtime power supply.

19. The device of claim 18, wherein the PIA includes a power distribution fabric for power distribution.

20. The device of claim 15, wherein the RPC ports are dedicated physical ports for facilitating power supply to various PPRs.

* * * * *